US008283638B2

(12) United States Patent
Chi et al.

(10) Patent No.: US 8,283,638 B2
(45) Date of Patent: Oct. 9, 2012

(54) METHOD FOR PREPARING ION SOURCE FROM NANOPARTICLES

(75) Inventors: Gou-Chung Chi, Jhongli (TW);
Ping-Jung Huang, Jhongli (TW);
Chung-Wei Chen, Jhongli (TW);
Ching-Jen Pan, Jhongli (TW); Yu-Lun Liu, Jhongli (TW); Fu-Chun Tsao, Jhongli (TW)

(73) Assignee: National Central University, Jhongli, Taoyuan County (TW)

( * ) Notice: Subject to any disclaimer, the term of this patent is extended or adjusted under 35 U.S.C. 154(b) by 541 days.

(21) Appl. No.: 12/560,451

(22) Filed: Sep. 16, 2009

(65) Prior Publication Data

US 2011/0012024 A1  Jan. 20, 2011

(30) Foreign Application Priority Data

Jul. 14, 2009  (TW) .............................. 98123774 A

(51) Int. Cl.
*H01J 27/02* (2006.01)
(52) U.S. Cl. ...................... 250/425; 250/423 R; 250/424
(58) Field of Classification Search .............. 250/423 R, 250/424, 425
See application file for complete search history.

(56) References Cited

U.S. PATENT DOCUMENTS

| | | | | |
|---|---|---|---|---|
| 5,861,630 A | * | 1/1999 | Becker | 250/423 R |
| 5,886,355 A | * | 3/1999 | Bright et al. | 250/492.21 |
| 6,392,188 B1 | * | 5/2002 | Milani et al. | 219/121.43 |
| 7,170,052 B2 | * | 1/2007 | Furutani et al. | 250/287 |
| 2005/0210859 A1 | * | 9/2005 | Bossmann et al. | 60/202 |
| 2009/0084163 A1 | * | 4/2009 | Chen et al. | 73/31.06 |
| 2009/0090862 A1 | * | 4/2009 | Kawana et al. | 250/288 |
| 2009/0267479 A1 | * | 10/2009 | Hutchison et al. | 313/309 |
| 2009/0272893 A1 | * | 11/2009 | Hieftje et al. | 250/282 |
| 2010/0084549 A1 | * | 4/2010 | Ermakov et al. | 250/283 |

OTHER PUBLICATIONS

Magnusson et al. "Gold nanoparticles: Production, reshaping, and thermal charging", J. of Nanoparticle Research 1: 243-251, 1999.*

* cited by examiner

*Primary Examiner* — Michael Logie
(74) *Attorney, Agent, or Firm* — Stites & Harbison, PLLC; Juan Carlos A. Marquez, Esq.

(57) ABSTRACT

A method for preparing an ion source from nanoparticles is provided. The method includes the steps of: providing nanoparticles, vaporizing the nanoparticles from a solid state to a gaseous state, and ionizing the gas to form the ion source. The ion source is prepared by placing solid nanoparticles in a stainless tube, heating and vaporizing the solid nanoparticles into a gaseous state, and ionizing the gas. The gas can be formed at a lower heating temperature than when solid lumps are used because solid nanoparticles have a lower melting point than solid lumps. Thus, the heating temperature is lowered, and the preparing time of the ion source is shortened. Besides, under the same temperature, an ion source prepared from nanoparticles provides higher vapor pressure and allows a higher implantation dose than when the ion source is prepared from solid lumps, thus expanding the applicability of ion implantation technology.

12 Claims, 8 Drawing Sheets

METHOD FOR PREPARING ION SOURCE FROM NANOPARTICLES

BACKGROUND OF THE INVENTION

1. Technical Field

The present invention relates to a method for preparing an ion source from nanoparticles. More particularly, the present invention relates to a method for preparing an ion source from nanoparticles, applicable to the technology of ion source preparation.

2. Description of Related Art

Ion implantation technology has been broadly used to dope semiconductor with ions. In a nutshell, the ion implantation technology involves implanting ions with certain energy into a substrate so as to alter the characteristics of the substrate.

FIG. 4 depicts the structure of a known ion implanter 200. As shown in FIG. 4, the ion implanter 200, which is configured for performing ion implantation, mainly includes an ion source system 100, an analyzing magnetic field 230, an ion acceleration system 240, and a target chamber 250. The ion source system 100 is a system for generating ions, in which an ion source material is ionized to form positively or negatively charged ions. Then, the ions are extracted by an extraction electrode 210. After the analyzing magnetic field 230 selects the needed ions, the selected ions form an ion beam 220 to enter the ion acceleration system 240. The ions are accelerated by an electric field in the ion acceleration system 240 before entering the target chamber 250, where the ions are implanted into a substrate to alter the characteristics thereof.

The ion source system 100 provides an ion source. More specifically, the ion source system 100 is equipped with a stainless tube. The heated stainless tube can melt solid lumps and vaporize the solid lumps into a gaseous state, such that the resultant gas enters an arc chamber by diffusion. In the arc chamber, the gas collides with thermal electrons emitted by a filament and is thereby ionized so as to form the ion source. To enhance the efficiency of ionization, magnets are disposed outside the arc chamber to form a magnetic field, thus enabling electronic gyration in the arc chamber and hence increasing the probability of collision.

Originally, trivalent atoms (e.g., boron atoms) or pentavalent atoms (e.g., phosphorus and arsenic atoms) were used as the ion source material; however, metal materials are now also being used. A metallic ion source material such as gold, copper, and cobalt is generally in the form of solid lumps. However, due to their high melting points (e.g., over 900° C.), metal materials cannot generate sufficiently high vapor pressure under low temperature (e.g., 10° C. to 800° C.). Therefore, it is difficult to apply metallic ion source materials to high-dose doping processes. Furthermore, commercially available ion implanters are designed for doping with trivalent or pentavalent atoms. As a result, some metal materials provided in these known ion implanters cannot be heated over 1000° C., thus hindering the application of ion implantation technology.

BRIEF SUMMARY OF THE INVENTION

The present invention provides a method for preparing an ion source from nanoparticles, wherein the nanoparticles are heated and vaporized into a gaseous state, and by virtue of the relatively low melting point of the nanoparticles, the heating temperature for preparing the ion source is lowered.

The present invention provides a method for preparing an ion source from nanoparticles, wherein the nanoparticles are used in lieu of solid lumps so as to reduce the required heating temperature and thereby shorten the preparation time of the ion source.

The present invention provides a method for preparing an ion source from nanoparticles, wherein the use of an ion source material in the nanoparticle form lowers the heating temperature and thus allows existing ion implanters to be directly used without modifications to their hardware structure and software settings.

To achieve the above and other effects, the present invention provides a method for preparing an ion source from nanoparticles, wherein the method includes the steps: providing nanoparticles, heating the nanoparticles so as to vaporize the nanoparticles from a solid state to a gaseous state to form a gas and ionizing the gas so as to form the ion source.

Implementation of the present invention at least involves the following inventive steps:

1. With nanoparticles having a lower melting point than solid lumps, the heating temperature can be reduced, thereby shortening the time required for ion implantation.

2. With nanoparticles generating higher vapor pressure than do solid lumps under the same temperature, the dose of ion implantation can be increased, thereby expanding the applicability of ion implantation technology.

3. With nanoparticles having a lower melting point than solid lumps, other substance within the stainless tube will not evaporate due to an excessively high heating temperature, and in consequence ion contamination can be prevented, thereby enhancing the stability of the resultant semiconductor elements.

BRIEF DESCRIPTION OF THE SEVERAL VIEWS OF THE DRAWINGS

A detailed description of further features and advantages of the present invention is given below, with a view to enabling a person skilled in the art to understand and implement the technical contents disclosed herein and to readily comprehend the objectives and advantages of the present invention by way of the following description, the appended claims, and the accompanying drawings, in which:

DETAILED DESCRIPTION OF THE INVENTION

Figure 1:
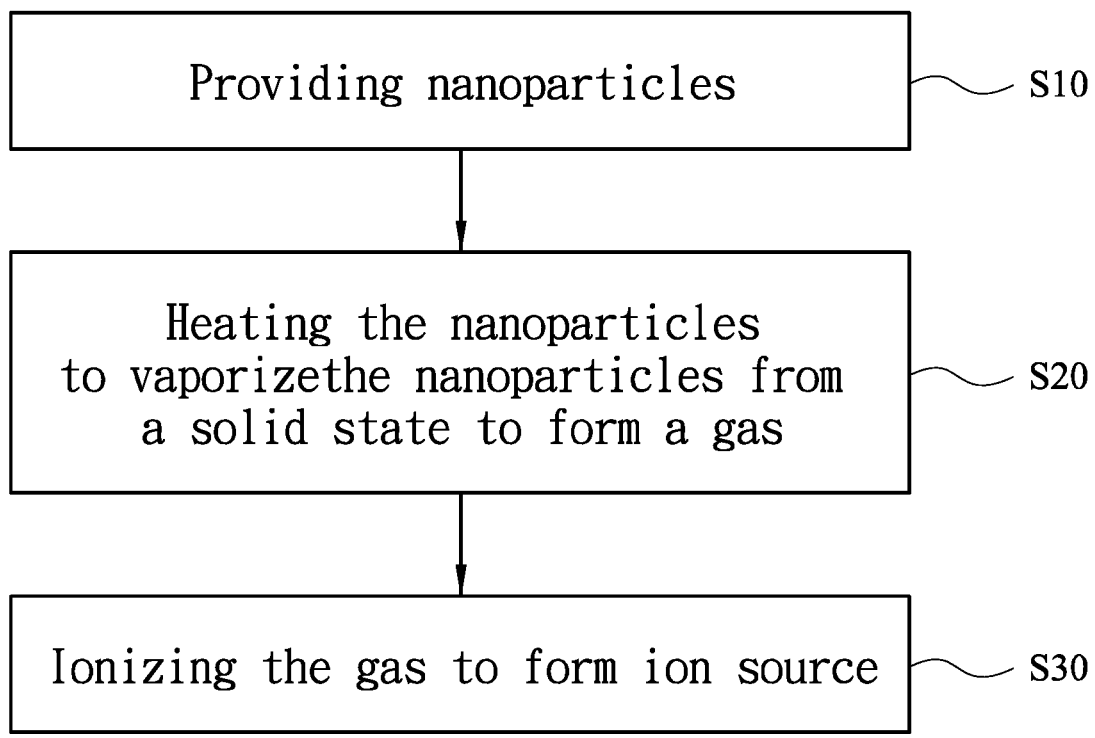
FIG. 1 is a flowchart of a method for preparing an ion source from nanoparticles according to the present invention.

As shown in FIG. 1, in an embodiment of the present invention, a method for preparing an ion source from nanoparticles includes the steps of: providing nanoparticles (S10);

heating the nanoparticles so as to vaporize the nanoparticles from a solid state to a gaseous state to form a gas (S20), and ionizing the gas so as to form the ion source (S30).

Figure 2:
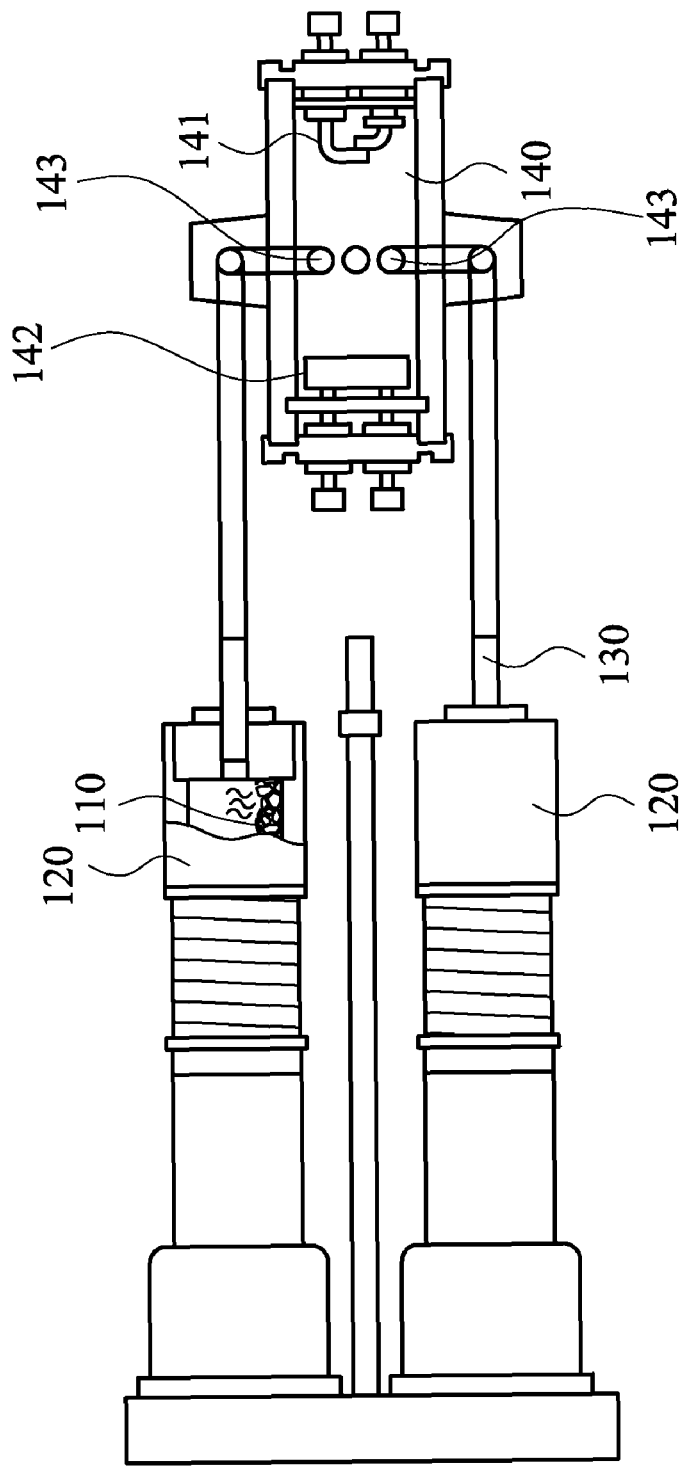
FIG. 2 is a schematic view of an ion source system according to the present invention.

At the step of providing nanoparticle (S10), referring to FIG. 2, nanoparticles 110 as an ion source material are provided. The nanoparticles 110 are placed in stainless tube 120 at an ion source system 100 of an ion implanter 200. The nanoparticles 110 are metal nanoparticles, such as nanoparticles of cobalt, gold, or copper. The diameter of each nanoparticle 110 is smaller than or equal to 100 nm, such as from 50 nm to 100 nm, or from 20 nm to 100 nm.

At the step of heating the nanoparticles so as to vaporize the nanoparticles from a solid state to a gaseous state to form a gas (S20), as shown in FIG. 2, the stainless tube 120 is used to heat the nanoparticles 110 at a temperature ranging from 10° C. to 900° C., or from 10° C. to 800° C. Preferably, the nanoparticles 110 are heated at a temperature ranging from 400° C. to 800° C., from 500° C. to 700° C., or from 300° C. to 900° C., wherein the heating temperature varies with the melting point of the nanoparticles 110 used.

Take cobalt nanoparticles for example. Cobalt nanoparticle each having a diameter ranging from 20 nm to 30 nm are placed in the stainless tube 120 in the ion source system 100. Then, the temperatures of the stainless tube 120 are increased to about 600° C., such that the cobalt nanoparticles are vaporized from a solid state to a gaseous state to form the gas. Since 600° C. is much lower than the melting point of solid cobalt lumps (approx. 1495° C.), the use of the cobalt nanoparticles effectively lowers the heating temperature.

As shown in FIG. 2, the gas generated by heating and vaporizing the nanoparticles 110 passes through nozzles 130 connected to the stainless tube 120 and then diffuses into an arc chamber 140.

Figure 3A:
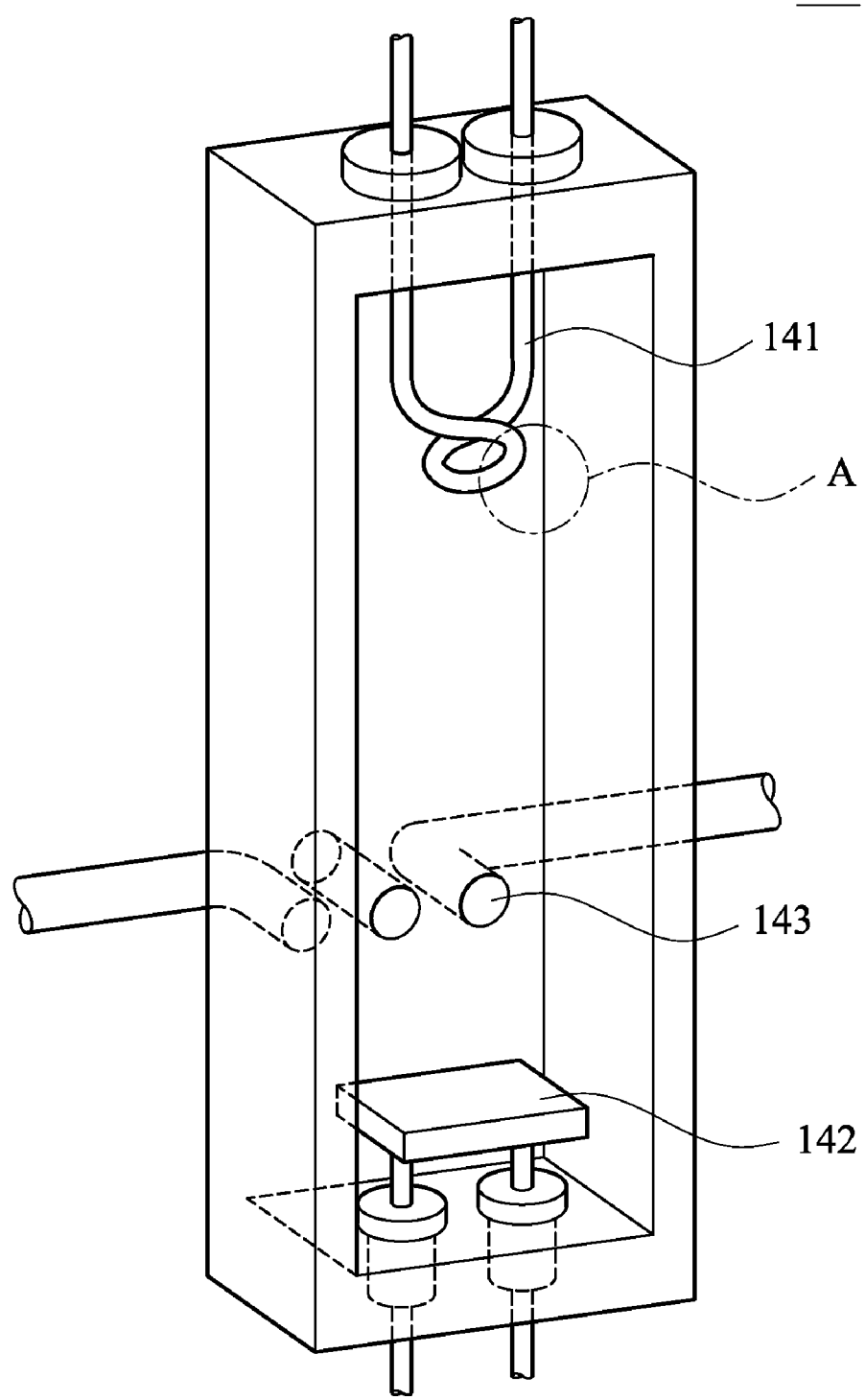
FIG. 3A is a schematic view of an arc chamber according to the present invention.

The step of ionizing the gas so as to form the ion source (S30) is detailed below. Referring to FIG. 3A, the arc chamber 140 is provided therein with a filament 141, a reflecting plate 142, and openings 143, wherein the openings 143 are connected to the stainless tube 120 (as shown in FIG. 2) or a gas cylinder.

Figure 3B:
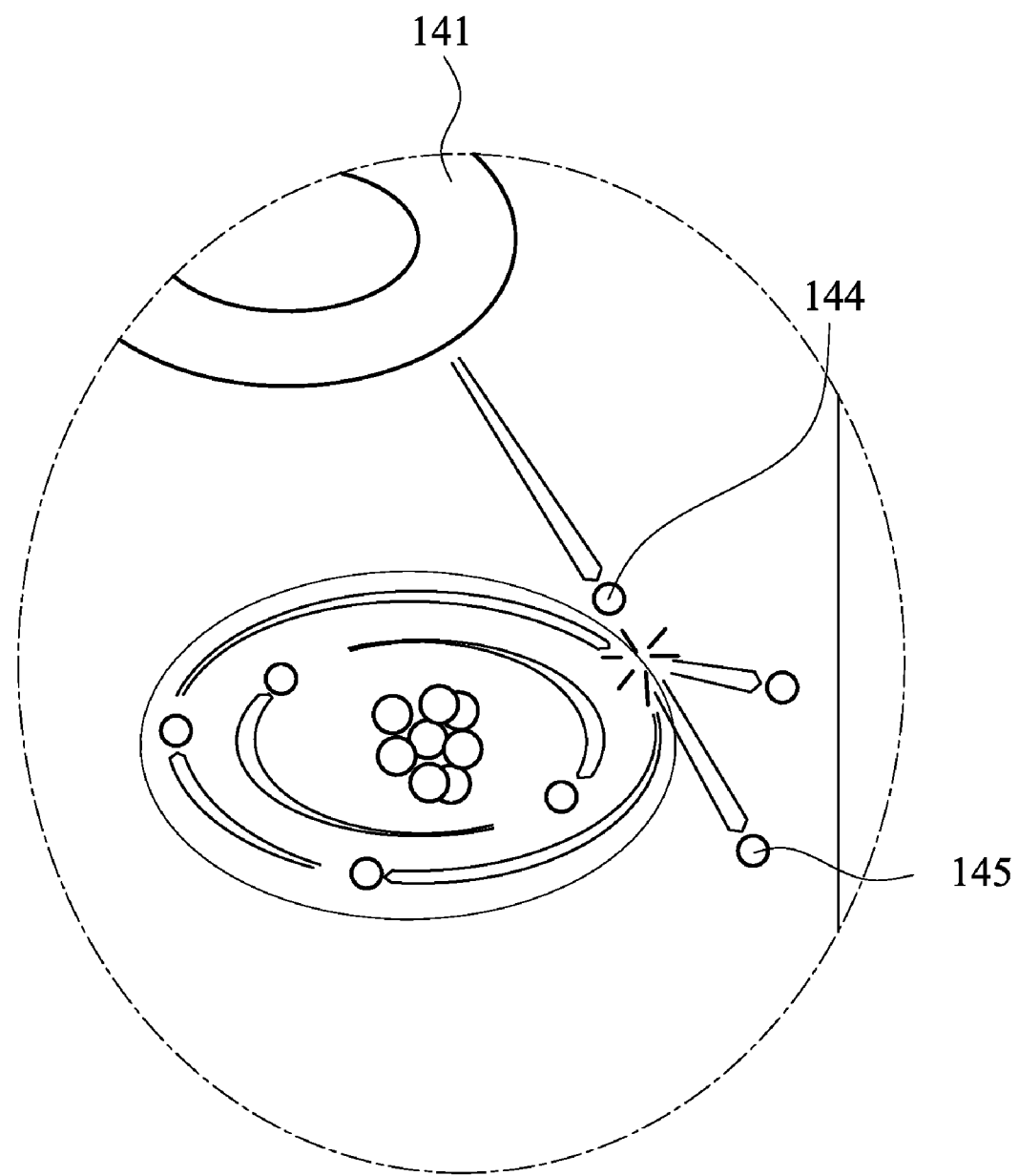
FIG. 3B is a schematic view of electron collision according to the present invention.

After the gas generated by heating and vaporizing the nanoparticles 110 diffuses into the arc chamber 140, electric current is applied to the filament 141 in the arc chamber 140. The filament 141 can be made of various materials, among which a tungsten coil is the most common. Referring to FIG. 3B, in which the filament 141 is made of a tungsten coil, the filament 141 releases thermal electrons 144 as an applied voltage increases the temperature of the filament 141. The thermal electrons 144 move towards the wall of the arc chamber 140 with relatively high electric potential. In their movement paths, the thermal electrons 144 collide with the outermost electrons 145 of the gas generated by heating and vaporizing the nanoparticles 110, and as a result, the gas are ionized to form an ion source.

Figure 3C:
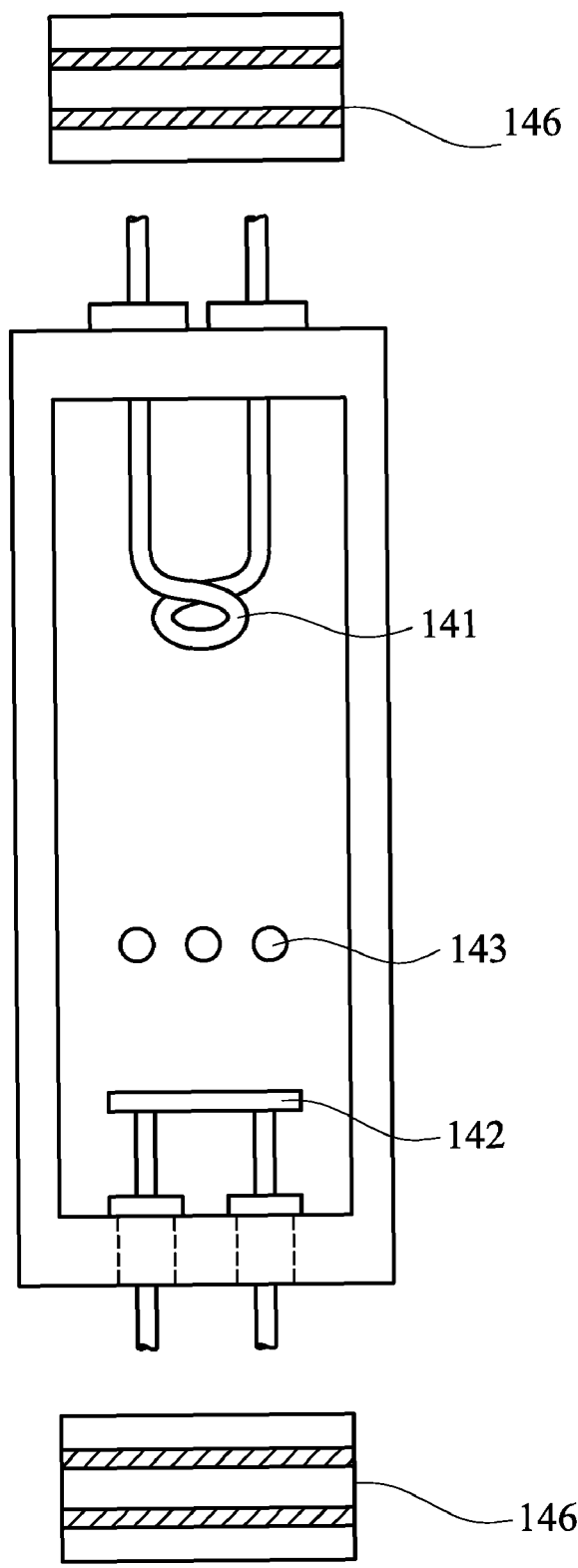
FIG. 3C is a schematic view of magnet arrangement outside the arc chamber according to the present invention.

As shown in FIG. 3C, magnets 146 are disposed outside the arc chamber 140, wherein the magnets 146 are electromagnets or permanent magnets. The magnetic field generated by the magnets 146 forces the thermal electrons 144 in the arc chamber 140 to gyrate. The gyrating thermal electrons 144 are also known as gyrating electrons. The movement paths of the gyrating electrons are relatively long and thus increase the probability of colliding with the gas in the arc chamber 140. Besides, the gyrating electrons cause resonant excitation of the gas, which enhances the efficiency of ionization and enables the ion flux of the ion source to meet the requirement for ion implantation of semiconductors.

Figure 4:
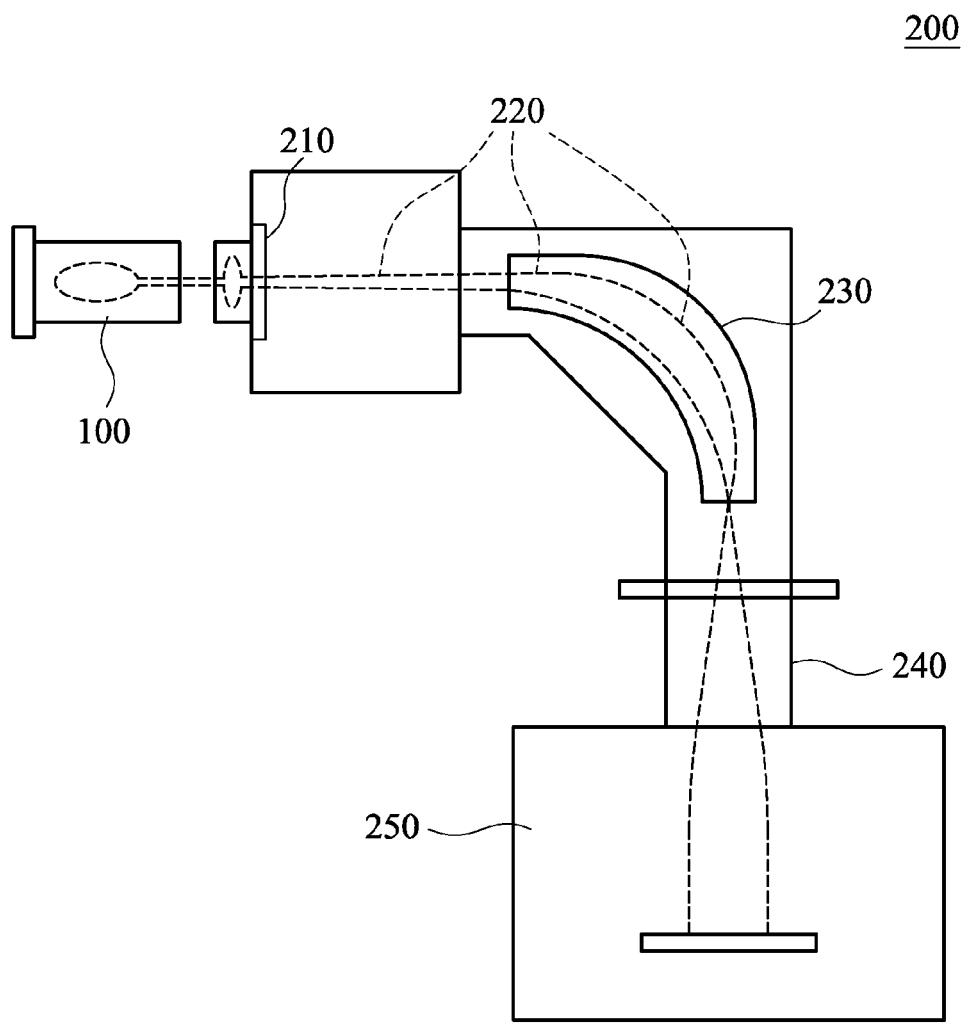
FIG. 4 illustrates the structure of a known ion implanter.

FIG. 4 is a schematic view of the ion implanter 200. When the ion flux is high enough to form an ion beam 220, the ions are extracted to the analyzing magnetic field 230 by an extraction electrode 210 which applies a voltage having a polarity opposite to that of the ions. The analyzing magnetic field 230 selects the ions needed for ion implantation, before the selected ions are accelerated by an acceleration system 240 to form the ion beam 220. Hence, the ions are implanted, in the form of the ion beam 220, into a substrate in a target chamber 250 and thereby alter the characteristics of the substrate.

Figure 5:
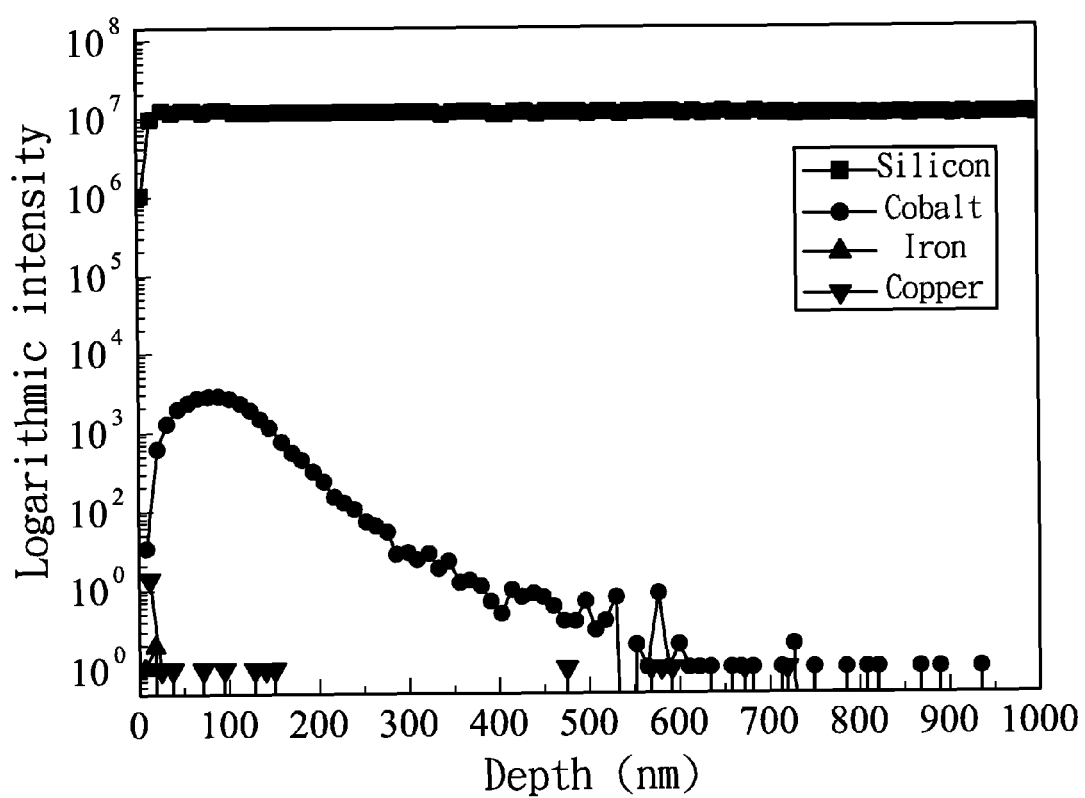
FIG. 5 is a plot showing qualitative analysis results of ion implantation into a silicon wafer, wherein the ions come from an ion source prepared from cobalt nanoparticles according to the present invention.

Analysis results of the concentration of ions implanted into a substrate in relation to the depth of the substrate are shown in FIG. 5. The results are obtained by preparing an ion source from cobalt nanoparticles, accelerating and implanting the cobalt ions generated from the ion source into a silicon wafer, with an acceleration energy of 120 KeV and an implantation dose of $8E13/cm^2$, and then using a Secondary Ion Mass Spectrometry (SIMS) for qualitative measurement. According to the results shown in FIG. 5, the ion source prepared from the nanoparticle form is capable of producing ion implantation effects required for ion implantation processes.

Figure 6:
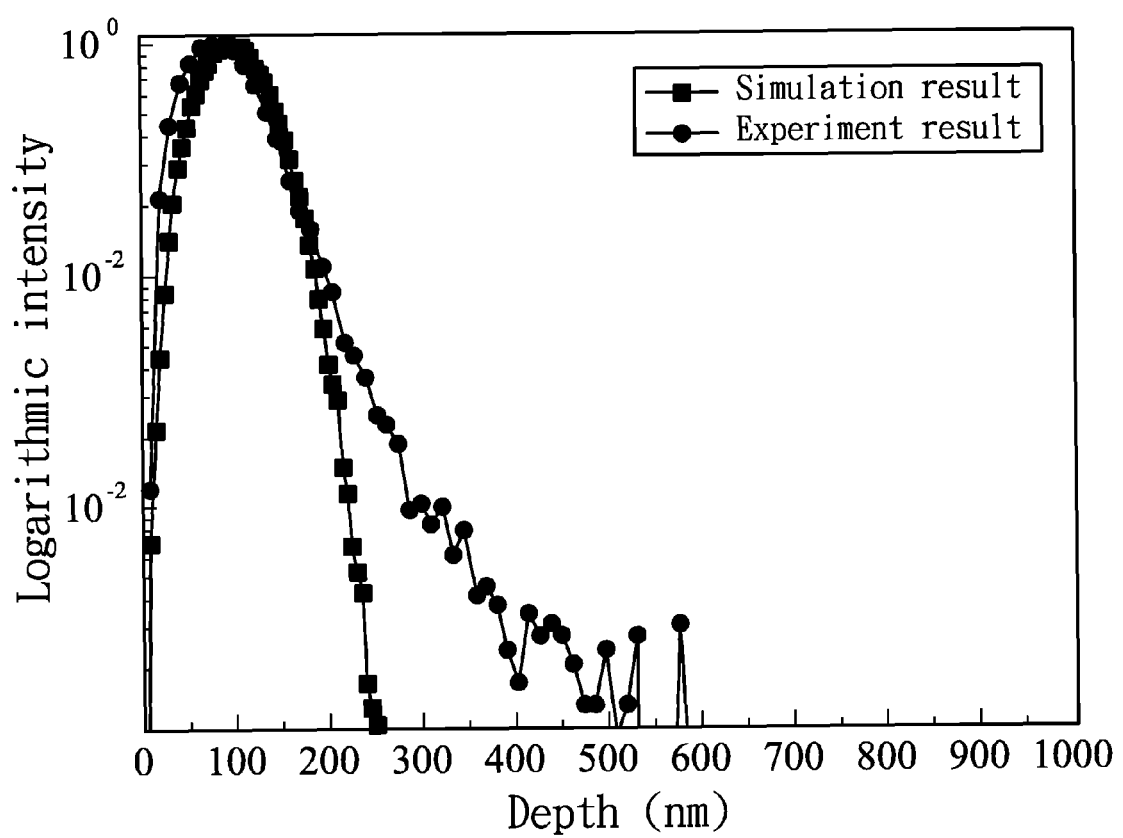
FIG. 6 is a plot showing a comparison between simulation and experiment results in the relation between concentration and depth of cobalt atoms implanted into a silicon wafer, wherein the cobalt atoms come from an ion source prepared from cobalt nanoparticles according to the present invention.

FIG. 6 shows a comparison between simulation results, obtained via a simulation software (SRIM 2008), of ion implantation concentration with respect to substrate depth, and actual SIMS measurements. According to the results shown in FIG. 6, the relation between ion implantation concentration and depth obtained with the ion source prepared from the nanoparticle form is consistent with the estimated result. In other words, the ion source prepared from the nanoparticle form provides the same effects as those provided by known ion sources and satisfies the requirements of ion implantation processes.

In addition to cobalt nanoparticles, other nanoparticles such as those of carbon, silicon, copper, and gold can also be used to prepare ion sources.

In addition to serving as an ion source for ion implantation technology, the ion source prepared from nanoparticles according to the method described in the present embodiment is equally applicable to other technologies employing an ion source, such as the Secondary Ion Mass Spectrometry.

The foregoing embodiment is illustrative of the characteristics of the present invention so as to enable a person skilled in the art to understand the disclosed subject matter and implement the present invention accordingly. The embodiment, however, is not intended to restrict the scope of the present invention. Hence, all equivalent modifications and variations which are made without departing from the spirit and principle of the present invention should fall within the scope of the appended claims.

What is claimed is:

1. A method of preparing an ion source from nanoparticles for ion implantation, comprising steps of:
   providing nanoparticles, the nanoparticles being placed in a stainless tube;
   heating the nanoparticles so as to vaporize the nanoparticles from a solid state to a gaseous state to form a gas;
   ionizing the gas so as to form the ion source;
   and implanting the ionized gas using the ion source.

2. The method according to claim 1, wherein the nanoparticles are metal nanoparticles.

3. The method according to claim 1, wherein the nanoparticles are one of cobalt nanoparticles, gold nanoparticles, and copper nanoparticles.

4. The method according to claim 1, wherein each said nanoparticle has a diameter smaller than or equal to 100 nm.

5. The method according to claim 1, wherein each said nanoparticle has a diameter ranging from 50 nm to 100 nm.

6. The method according to claim 1, wherein each said nanoparticle has a diameter ranging from 20 nm to 100nm.

7. The method according to claim 1, wherein the step of heating the nanoparticles is performed at a temperature ranging from 10° C. to 900° C.

8. The method according to claim 1, wherein the step of heating the nanoparticles is performed at a temperature ranging from 10° C. to 800° C.

9. The method according to claim 1, wherein the step of heating the nanoparticles is performed at a temperature ranging from 400° C. to 800° C.

10. The method according to claim 1, wherein the step of heating the nanoparticles is performed at a temperature ranging from 500° C. to 700° C.

11. The method according to claim 1, wherein the step of heating the nanoparticles is performed at a temperature ranging from 300° C. to 900° C.

12. The method according to claim 1, wherein the gas is ionized by resonant excitation caused by gyrating electrons, so as to form the ion source.

* * * * *